(12) United States Patent
Wu et al.

(10) Patent No.: US 6,287,883 B1
(45) Date of Patent: Sep. 11, 2001

(54) METHOD FOR FABRICATING LED

(75) Inventors: Ching-Huei Wu, Hsinchuang; Chun-Chi Chou, Taipei, both of (TW)

(73) Assignee: Unity Opto Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 09/666,606

(22) Filed: Sep. 20, 2000

(51) Int. Cl.$^7$ ................................................. H01L 21/00
(52) U.S. Cl. ................................................. 438/29
(58) Field of Search ................................ 438/29, 22–28, 438/30–47; 257/79–93

(56) References Cited

U.S. PATENT DOCUMENTS 5,998,085 * 12/1999 Isberg et al. ........................ 430/200

FOREIGN PATENT DOCUMENTS

360223889-A * 11/1985 (JP) ........................................ 313/468

* cited by examiner

*Primary Examiner*—Chandra Chaudhari
*Assistant Examiner*—Craig Thompson
(74) *Attorney, Agent, or Firm*—Bacon & Thomas, PLLC

(57) ABSTRACT

A method for fabricating a LED has the steps of affixing the chip, wire bonding, isolation layer formation; and phosphor sedimentation. Before the isolation layer becomes solid, a phosphor is applied onto the outer face of the isolation layer and by means of the sedimentation effect, the phosphor is thus immersed in the isolation layer evenly so as to achieve the purpose of emit light evenly.

10 Claims, 8 Drawing Sheets

METHOD FOR FABRICATING LED

BACKGROUND OF THE INVENTION

1. Field of the Invention

The present invention relates to a method for fabricating LED (Light Emitting Diode), and more particularly to a method using sedimentation to add the phosphor onto the surface of the LED, so as to allow the phosphor to absorb the light from the illumination chip and emit a light having the wave length that is different from that of the absorbed light. The emitted light from the phosphor combines with the light from the illumination chip to form a become a desired visible light, such as white, red, green light . . . etc.

2. Prior Art Description

Because LED is light-weight, energy saving and durable, it becomes more and more popular around the world. Especially, the LED is taking place of the normal fluorescent light in daily use. However, the manufacturer uses the LED's characteristic of emitting a mono-color in its peak and places a red, a blue and a green illumination chips or the a yellow and a blue chips side by side. Thereafter, by controlling the current and voltage, the illumination chips are able to emit a desired white light. Although, this kind of arrangement does have the effect to generate the desired white light, the mixing of different lights often causes color spot, which causes an inclination of a certain color to the emitted light.

To cope with the problem, with reference to FIGS. 9 and 10, a method for fabricating the LED is developed and comprises the steps of:

Fixing the chip (81): an illumination chip (93) is adhered to a bracket (91) by means of a conductive gel;

Wire bonding (82): a pair of wires (96) is welded between the chip (93) and the bracket (91);

Mixing (83): a phosphor (941) is mixed with a silica gel to become an adhesive (94);

Gluing (84): the adhesive (94) is glued on the outer face of the chip (93);

Forming (85): a casing (95) made of epoxy is used to encase the chip (93) and the bracket (91) to form a LED (9); and Testing (86): tests are held to examine the spectrum of the formed LED.

The method uses the chip (93) to emit the blue light and the phosphor absorbs a part of the emitted blue light and then emits a yellow light to mix with the blue light to become white light.

This method does have the effect to generate the white light, however it till encounters drawbacks, such as:

1. The method requires that the chip and the wires should be first fixed and that the adhesive (94) should also be pre-mixed to have the desired concentration, which is quite complex and is cost ineffective;
2. Because the adhesive (94) is glued on the outer face of the chip (93), the thickness of the glued adhesive (94) and the concentration of the adhesive will affect the quantity of the phosphor contained in the adhesive (94) and this will eventually affect the characteristic of the emitted light;
3. The adhesive on the outer surface of the chip (93) will be heated after applied so as to form the casing (95) required for the chip (93), which is too time consuming and the quality and quantity of the production can not be well controlled;
4. Due to the fraction coefficient of the adhesive (94) and the casing (95) being different, the emitted light from the chip (93) will be affected;
5. Should the phosphor (941) be spread on the outer face of the chip (93), i.e. on the casing (95), the phosphor (941) is quite easy to come off from the casing (95) by any kind of impact or scratch and the two different wavelength lights can't reach the even mixing effect. Thus, it is will only see blue light in some part of spatial light output pattern.
6. The ultraviolet rays from the sun light will easily increase the temperature of the casing (95), which will increase the aging to the casing (95) and will have an unwanted effect to the emitted light.

To overcome the above mentioned shortcomings, the present invention provides an improved method for fabricating the light emitting diode.

SUMMARY OF THE INVENTION

The method uses the sedimentation effect to allow the phosphor to evenly distributed around the chip so as to reduce the steps of mixing and gluing. Accordingly, the cost is greatly reduced and the process is also greatly simplified.

Another objective of the invention is that the sedimentation effect allows the phosphor to have an even thickness on the chip, which increases the quality of the product.

Still another objective of the invention is that a layer of ultraviolet-proof is applied outside the casing of the chip to filter out the ultraviolet rays in the sun light so as to avoid the polarization problem caused by the aging of the casing.

Other objects, advantages and novel features of the invention will become more apparent from the following detailed description when taken in conjunction with the accompanying drawings.

DETAILED DESCRIPTION TO THE PREFERRED EMBODIMENT

Figure 1:
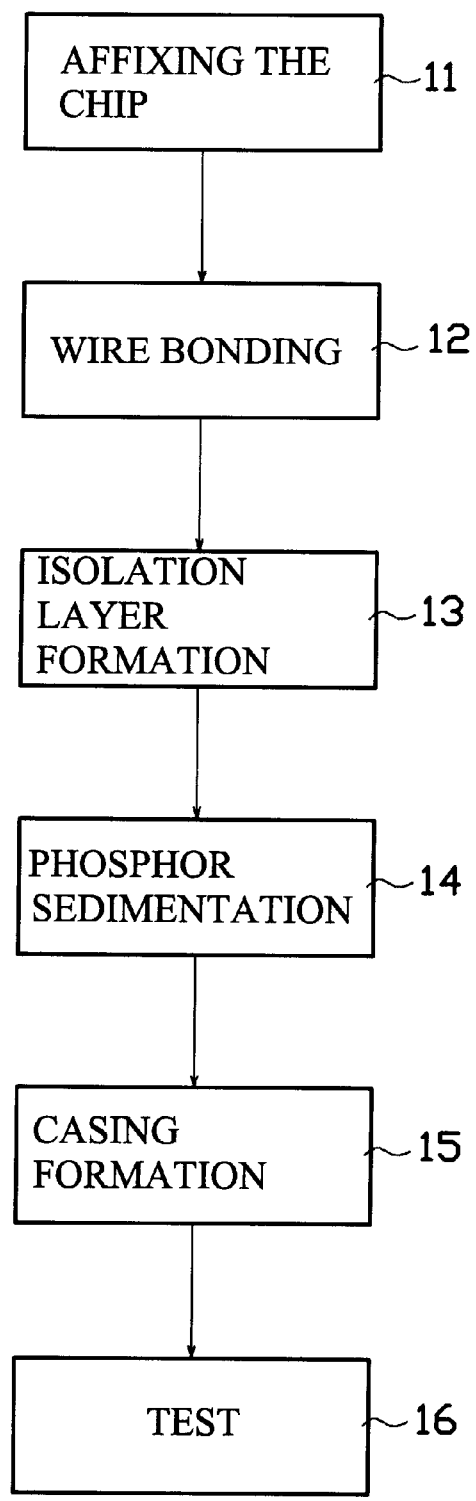
FIG. 1 is a flow chart of the method in accordance with the present invention.
Figure 2:
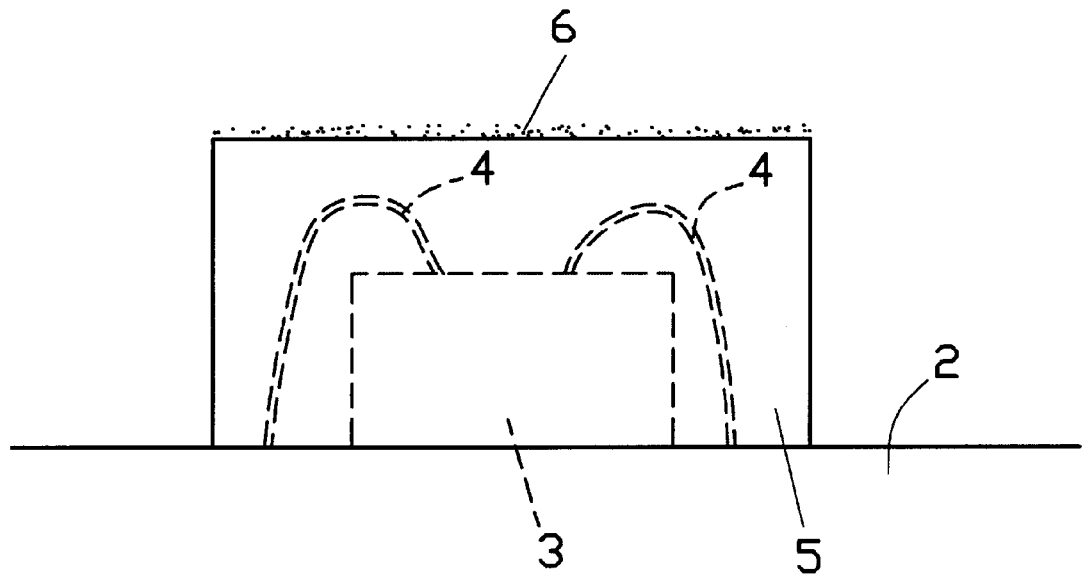
FIGS. 2 and 3 are schematic views showing the structure of the first preferred embodiment formed by means of sedimentation.
Figure 3:
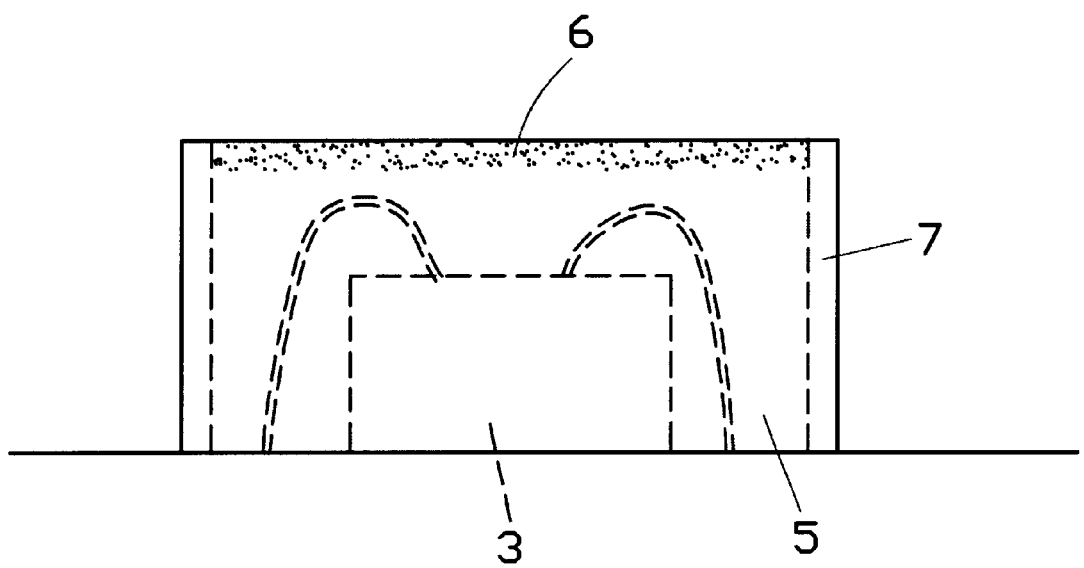

With reference to FIGS. 1, 2 and 3, a method for fabricating a LED (light emitting diode) comprises the steps of:

Affixing the chip (11); by means of a glue, the chip (3) is fixed securely on a substrate (2) adapted to connect to the power source (not shown). The chip (3) can be an InGaN on Sapphire Substrate, an InGaN on SiC Substrate or any other suitable material, which can emit a blue light;

Wire bonding (12); wires (4) are connected between the chip (3) and the substrate (2);

Isolation layer formation (13); an isolation layer (5) with a predetermined thickness and made of epoxy resin is formed outside the chip (3) and allows the light to pass therethrough;

Phosphor sedimentation (14); before the isolation layer (5) becomes solid, a phosphor (6) is applied onto the outer face of the isolation layer (5) and by means of the sedimentation effect, the phosphor (6) is immersed in the isolation layer (5), wherein the phosphor (6) may be in power state or liquid state. The application means stands that the mixing of the phosphor (6) into the isolation layer (5) is not limited to a specific method and any known and suitable method may be used to mix the phosphor (6) into the isolation layer (5) prior to the isolation layer (5) solidification process;

Casing formation (15); a casing (7) made by means of injection molding is applied outside the isolation layer (5). After the entire process is finished or prior to the step of casing formation, a layer of ultraviolet-proof paint is implemented to filter out the ultraviolet rays from the sun light so as to decrease the aging effect to the phosphor (6) and to reduce the temperature of the chip (3) as well; and Testing (16); tests are held to examine the characteristics of the product to check if the LED can be operated normally.

It is to be noted that the method of the present invention uses the sedimentation effect to immerse the phosphor into the isolation layer (5) prior to the solidification process of the isolation layer (5). When compared with the conventional method, the step of gluing and the step of mixing are no longer necessary and thus, the cost and quality are greatly increased. Beside that, because the time for the entire process is reduced, the quantity of the product may also be increased.

Furthermore, the thickness of the phosphor can be controlled by using the sedimentation effect to mix the phosphor into the isolation layer (5), such that the phosphor can be evenly distributed in the isolation layer (5) to avoid separation of the phosphor from the isolation layer (5).

Figure 4:
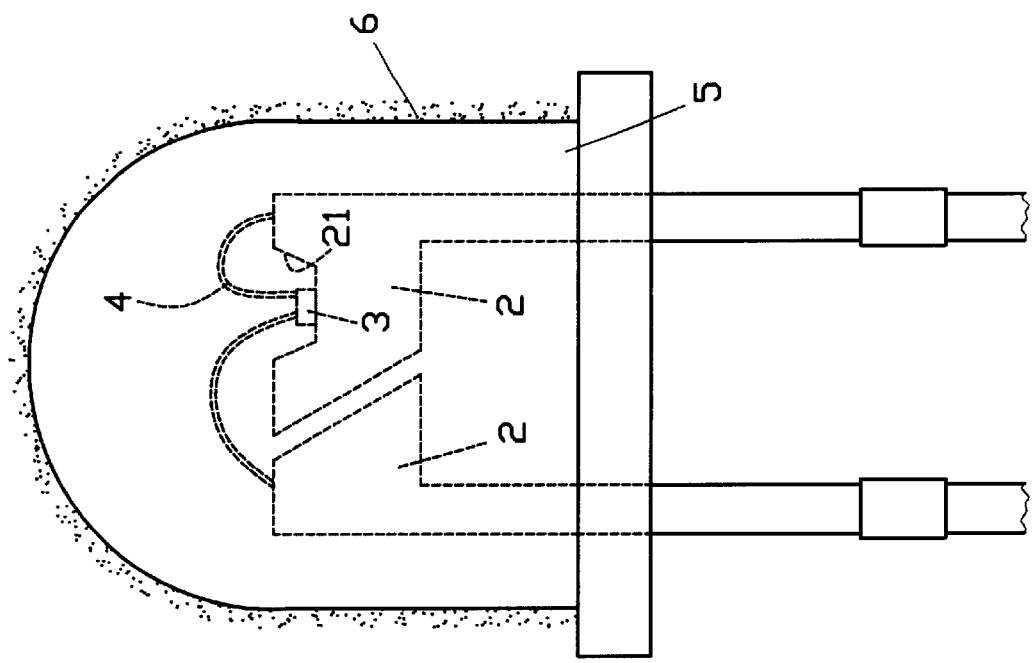
FIGS. 4 and 5 are schematic views showing the structure of the second preferred embodiment formed by means of sedimentation.
Figure 5:
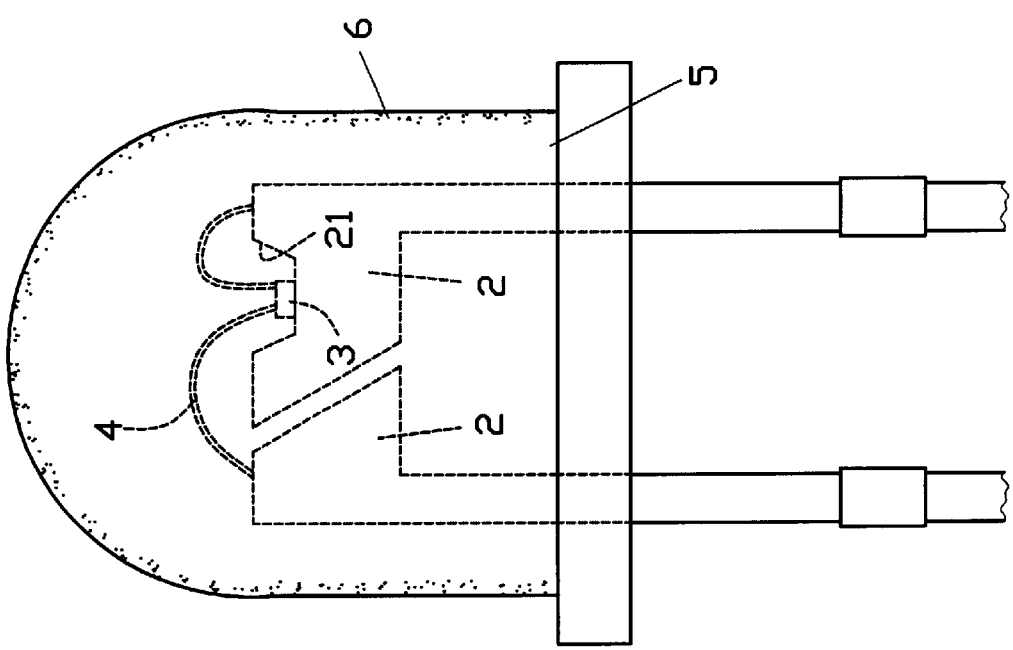

It is known from the accompanied drawing of FIGS. 4 and 5 that the step of casing forming is removed from the process, such that a potential problem of affecting the lighting of the LED by means of the difference of the refraction coefficient between the isolation layer (5) and the casing (7) may be prevented.

Figure 6:
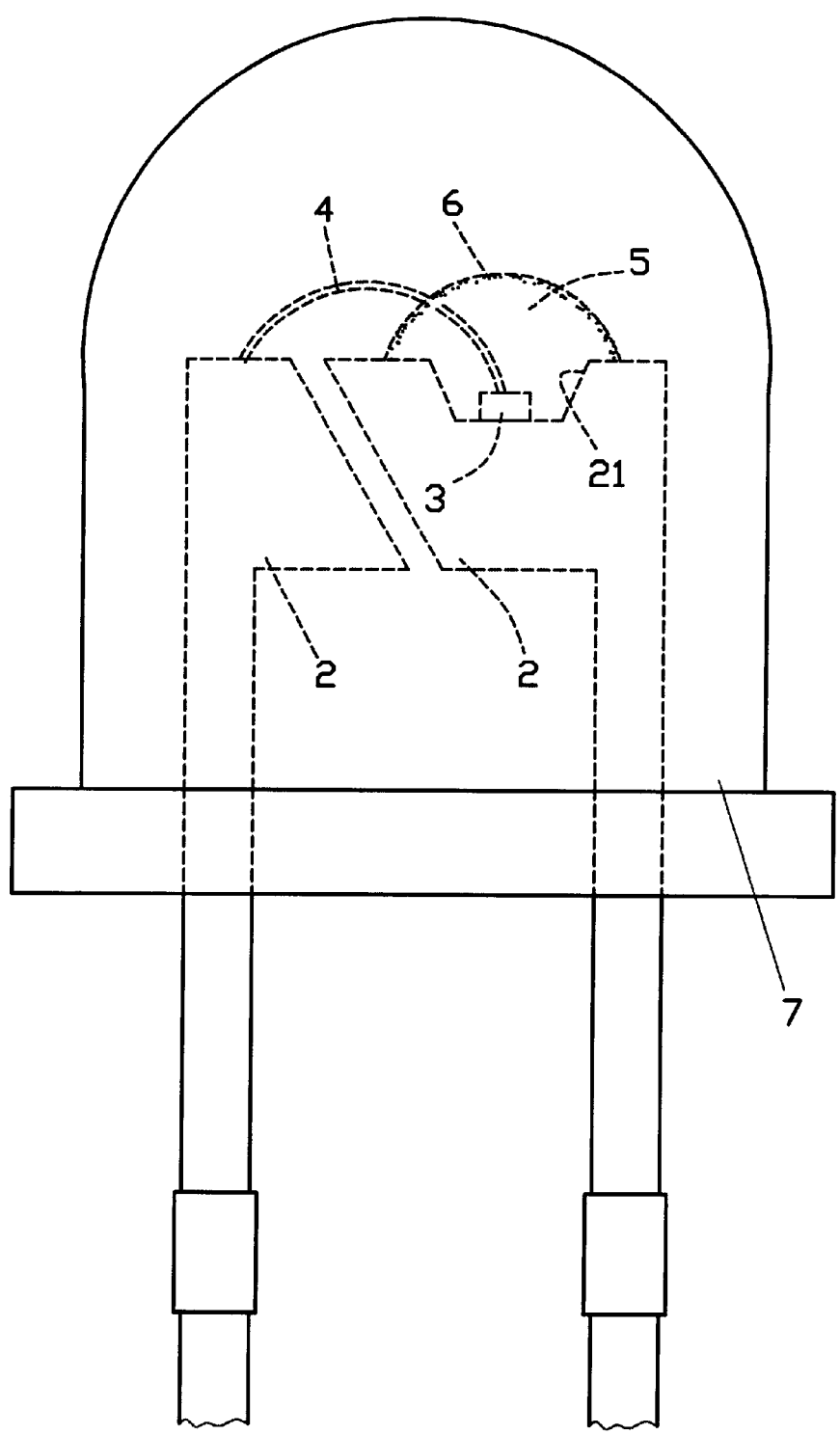
FIG. 6 is a schematic view showing the structure of the third preferred embodiment formed by means of sedimentation.

Further, FIGS. 3 and 6 are different structures of the LED fabricated by the method of the invention, wherein the difference lies between the enclosed areas by the isolation layer (5) and the conductivity of the chip (3), which is not the focus of the invention, therefore detailed description thereof is omitted.

Figure 7:
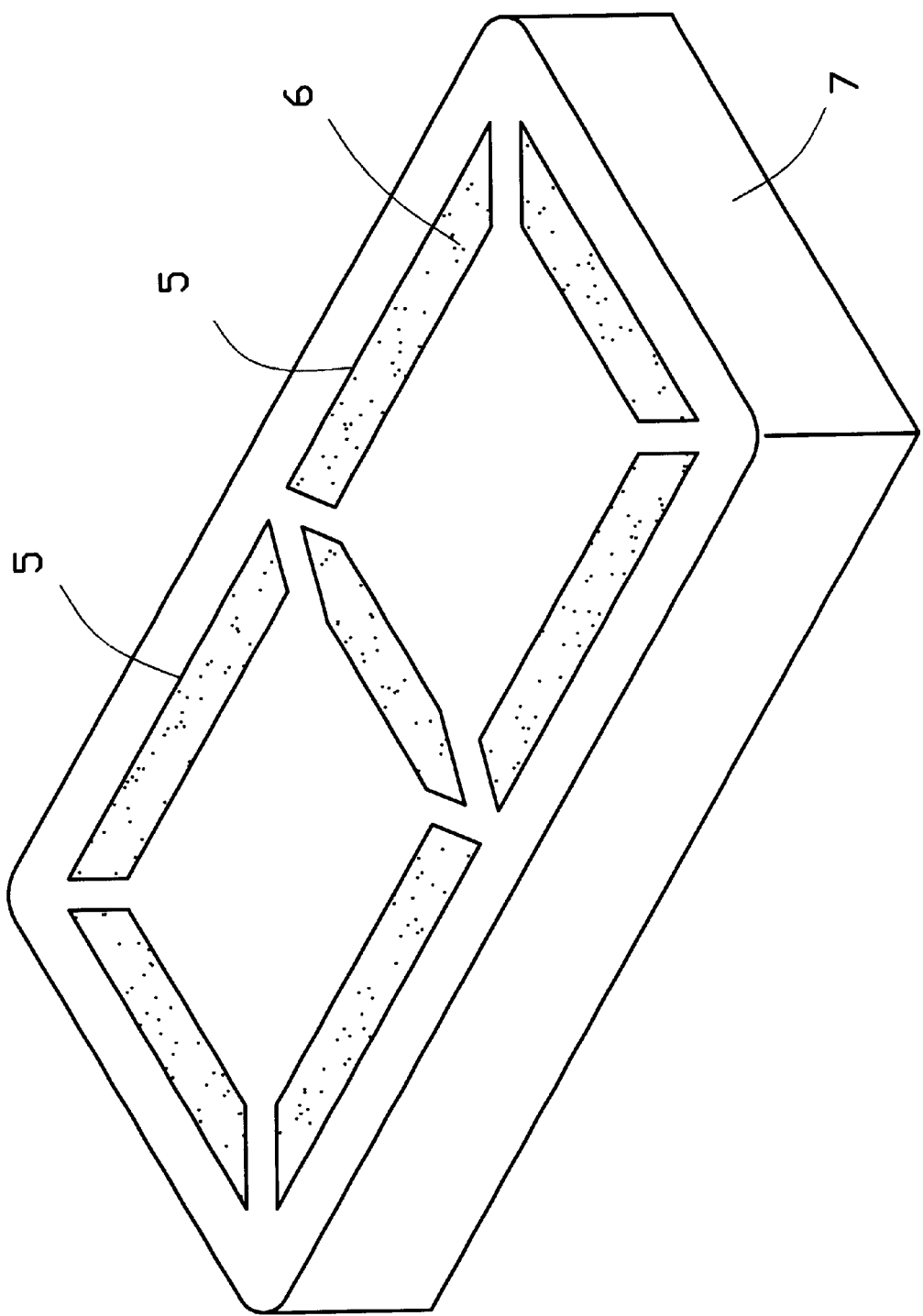
FIG. 7 is a perspective view showing the fourth preferred embodiment of the invention.
Figure 8:
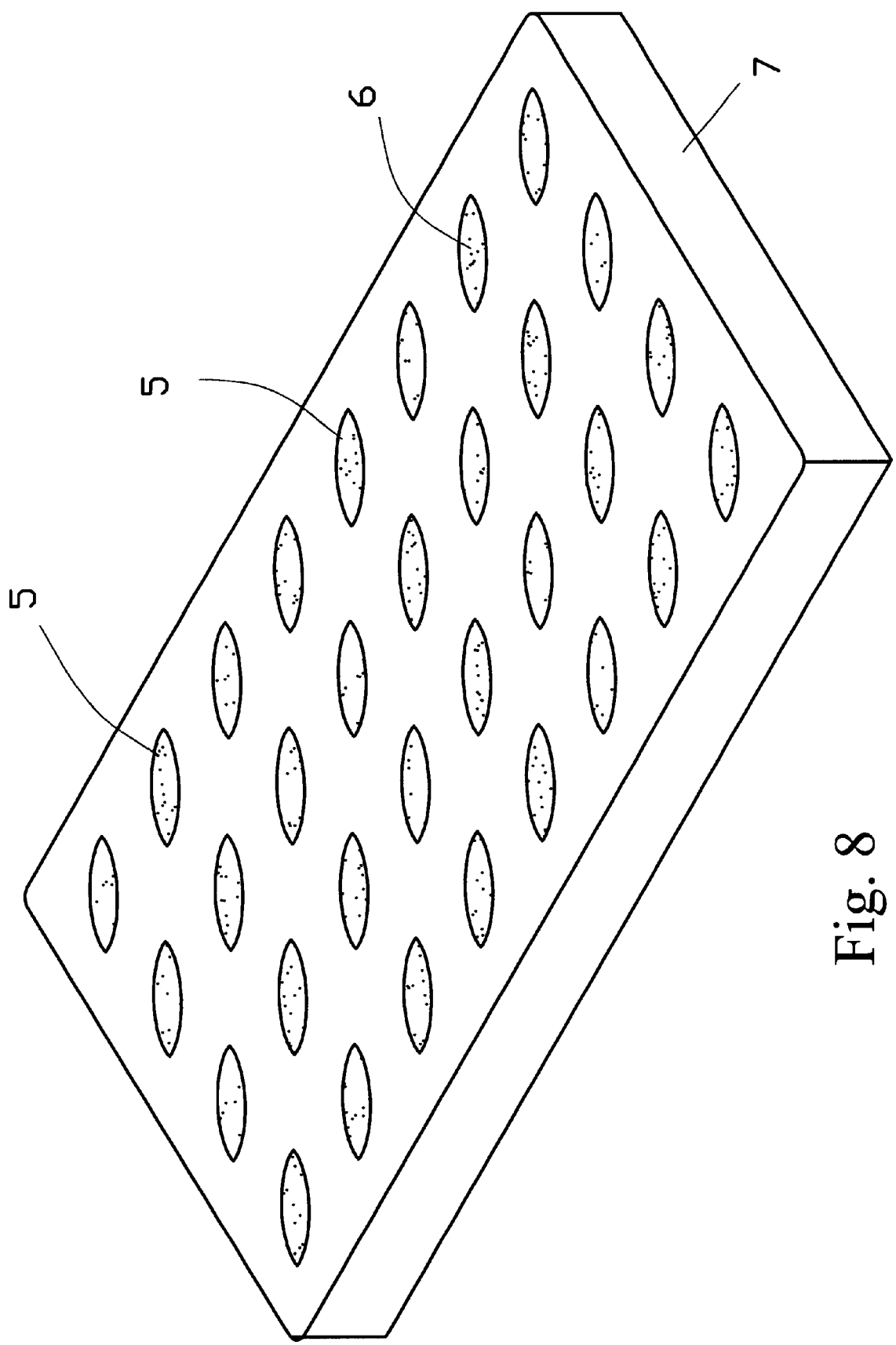
FIG. 8 is a perspective view showing the fifth preferred embodiment of the invention.
Figure 9:
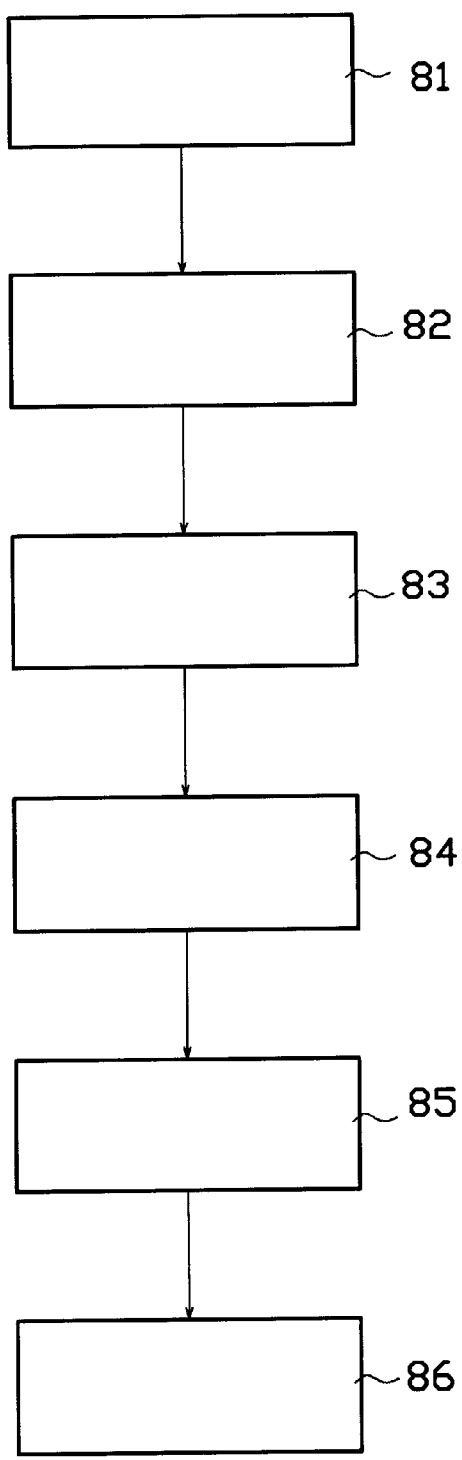
FIG. 9 is a flow chart showing the flow chart of the conventional method of fabricating a LED.
Figure 10:
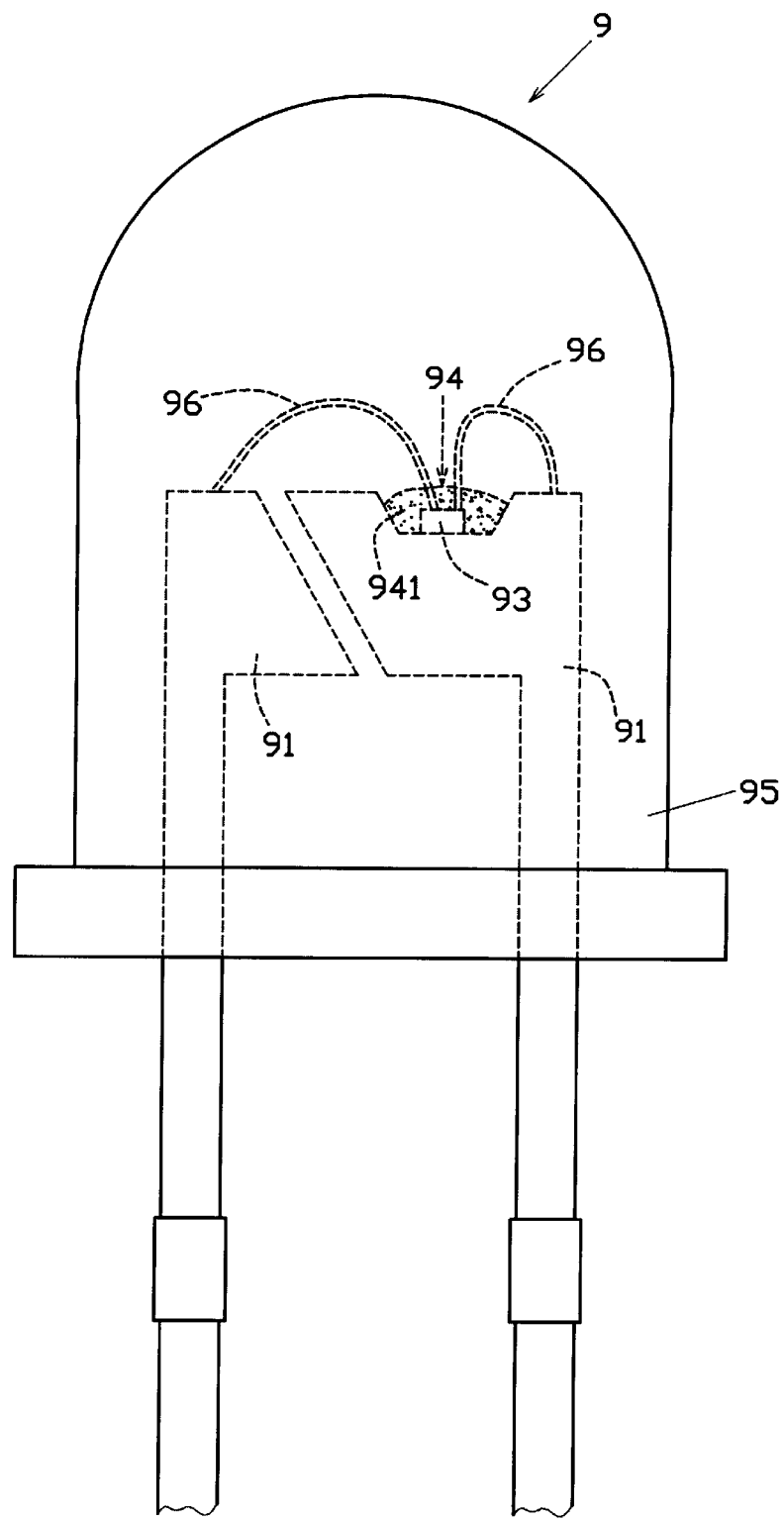
FIG. 10 is a plan view showing the structure of a conventional LED.

With reference to FIGS. 7 and 8, a seven-step display and a matrix-type display are shown and all of LED used in the displays are fabricated by the method of this invention.

It is concluded that the present invention has the advantages:

Simple process:

Using the sedimentation effect, the phosphor is able to be distributed evenly in the isolation layer so that the emitted light is uniformed and the mixing step, the gluing step of the conventional method are therefore simplified. Accordingly, the cost for fabricating the product is greatly reduced.

Endurable:

A layer of ultraviolet-proof paint is applied to the outer surface of the isolation layer (5) to increase the durability of the LED made by the method and avoid the aging problem caused by the ultraviolet rays from the sun light.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for fabricating a LED comprising the steps of:

affixing the chip, wherein the chip is fixed securely on a substrate (2) adapted to connect to the power source;

wire bonding, wherein wires are connected between the chip (3) and the substrate;

isolation layer formation; wherein an isolation layer with a predetermined thickness is formed outside the chip and is made of a material allowing the light to pass therethrough; and phosphor sedimentation, wherein before the isolation layer becomes solid, a phosphor is applied onto the outer face of the isolation layer and by means of the sedimentation effect, the phosphor is immersed in the isolation layer evenly.

2. The method as claimed in claim 1 further comprising the step of casing formation, wherein a casing made by means of injection molding is applied outside the isolation layer to enclose the isolation layer.

3. The method as claimed in claim 1, wherein the isolation layer is made of epoxy resin.

4. The method as claimed in claim 3, the phosphor is in liquid state.

5. The method as claimed in claim 4, wherein a paint of ultraviolet-proof is applied outside the isolation layer.

6. The method as claimed in claim 2, wherein a ultraviolet-proof paint is applied outside the casing.

7. The method as claimed in claim 3, wherein the phosphor is in powder state.

8. The method as claimed in claim 7, wherein a paint of ultraviolet-proof is applied outside the isolation layer.

9. The method as claimed in claim 1, wherein the chip can be a InGaN on Sapphire Substrate.

10. The method as claimed in claim 1, wherein the chip can be a InGaN on SiC Substrate.

* * * * *